(12) United States Patent
Zhang et al.

(10) Patent No.: US 10,845,406 B2
(45) Date of Patent: Nov. 24, 2020

(54) SEMICONDUCTOR DEVICE AND METHOD OF MANUFACTURING THE SAME

(71) Applicant: Dynax Semiconductor Inc., Kunshan (CN)

(72) Inventors: Naiqian Zhang, Kunshan (CN); Jian Liu, Kunshan (CN); Feihang Liu, Kunshan (CN); Yi Pei, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 0 days.

(21) Appl. No.: 16/415,497

(22) Filed: May 17, 2019

(65) Prior Publication Data

US 2019/0271737 A1 Sep. 5, 2019

Related U.S. Application Data

(63) Continuation of application No. PCT/CN2018/094450, filed on Jul. 4, 2018.

(30) Foreign Application Priority Data

Jul. 4, 2017 (CN) .......................... 2017 1 0538379

(51) Int. Cl.

| | | |
|---|---|---|
| *G01R 31/26* | (2020.01) | |
| *H01L 21/8234* | (2006.01) | |
| *H01L 27/02* | (2006.01) | |
| *H01L 29/66* | (2006.01) | |
| *H01L 29/872* | (2006.01) | |
| *H01L 23/544* | (2006.01) | |
| *H01L 21/66* | (2006.01) | |
| *H01L 29/41* | (2006.01) | |

(52) U.S. Cl.
CPC .. *G01R 31/2644* (2013.01); *H01L 21/823418* (2013.01); *H01L 21/823437* (2013.01); *H01L 21/823475* (2013.01); *H01L 22/34* (2013.01); *H01L 23/544* (2013.01); *H01L 27/0207* (2013.01); *H01L 29/41* (2013.01); *H01L 29/66143* (2013.01); *H01L 29/872* (2013.01)

(58) Field of Classification Search
CPC ............ G01R 31/2644; G01R 31/2884; H01L 23/544; H01L 22/34; H01L 29/41; H01L 21/823418; H01L 21/823437; H01L 21/823475; H01L 27/0207; H01L 29/66143; H01L 29/872; H01L 29/66075
See application file for complete search history.

(56) References Cited

U.S. PATENT DOCUMENTS

2014/0334522 A1* 11/2014 Meiser ................... H01L 27/16
374/178
2018/0083051 A1* 3/2018 Chan ...................... H01L 23/544

* cited by examiner

*Primary Examiner* — Mohammed R Alam
(74) *Attorney, Agent, or Firm* — Flener IP & Business Law; Zareefa B. Flener

(57) ABSTRACT

The present disclosure provides a semiconductor device and a method of manufacturing the same, and relates to the field of semiconductor devices. The semiconductor device includes an active region, a test region and a passive region located outside the active region and the test region, wherein a standard device is formed in the active region, and a test device for testing performance parameters of the standard device is formed in the test region.

17 Claims, 5 Drawing Sheets

SEMICONDUCTOR DEVICE AND METHOD OF MANUFACTURING THE SAME

CROSS-REFERENCE TO RELATED APPLICATIONS

This application is a continuation of international application No. PCT/CN2018/094450 filed on Jul. 4, 2018, which claims priority of Chinese patent application No. 201710538379.5 filed on Jul. 4, 2017, all contents of which are incorporated herein in their entireties by reference.

TECHNICAL FIELD

The present disclosure relates to the field of semiconductor and semiconductor manufacturing technologies, and more particularly, to a semiconductor device and a method of manufacturing the same.

BACKGROUND

In recent years, wireless communication technologies have been expanding in applications such as communication base stations, aerospace, automation, automotive electronics, high-temperature radiation environments, phased array radars, electronic countermeasures, military satellite communications and smart weapons. Modern wireless communication technologies are moving toward higher frequency, higher power, and higher efficiency, which puts forward higher requirements on the design of wireless signal transmitters. As an important part of the transmitters, radio frequency and microwave power amplifiers have attracted more and more attention.

As a core component in power amplifiers, transistors have gradually become a hot topic in current research. The transistors used in the power amplifiers include bipolar transistors (BJT), gallium arsenide metal semiconductor field effect transistors (GaAs MESFET), junction field effect transistors (JFET), laterally diffused metal oxide semiconductor (LDMOS) and gallium nitride (GaN) transistors, etc., and different transistors are used in different power amplifier designs.

At present, in transistor manufacturing, in order to meet the requirements of higher frequency, higher power and higher efficiency of modern communication, it is generally required to design large-sized devices as standard devices. These standard devices have a relatively large gate width, so that the devices have a relatively large current density in a turn-on state, thereby exceeding a test range of ordinary wafer-level electrical test equipment. Some electrical parameters such as saturation current and output power cannot be obtained through the wafer-level test, developers often need to test performance parameters of chips of large-sized devices one by one after cutting and packaging, and then screen out qualified devices, and thus the production cycle and packaging resources are significantly increased, and the production cost is increased.

SUMMARY

In view of the above, an object of the present disclosure is to provide a semiconductor device and a method of manufacturing the same, so as to solve above problems.

To achieve the above object, the present disclosure provides following technical solutions.

A semiconductor device, including: an active region, a test region and a passive region located outside the active region and the test region, wherein a standard device is formed in the active region, and a test device for testing performance parameters of the standard device is formed in the test region.

In an embodiment of the present disclosure, the test device and the standard device have an electrical characteristic correlation, and the test device has a normal electrical characteristic function and can independently perform electrical characteristic measurement.

In an embodiment of the present disclosure, a size of the test device is smaller than that of the standard device, and a gate width of the test device is smaller than that of the standard device.

In an embodiment of the present disclosure, the standard device includes a plurality of sources, a plurality of drains and a plurality of gates; and the test device includes a first electrode and a second electrode, wherein the first electrode is the same as the drains and the second electrode is the same as one of the sources and the gates.

In an embodiment of the present disclosure, the second electrode is the same as the gates, and a distance between the first electrode and the second electrode is equal to a distance between a gate and a drain adjacent thereto among the plurality of gates and the plurality of drains.

In an embodiment of the present disclosure, the second electrode is the same as the sources, and a distance between the first electrode and the second electrode is equal to a sum of a distance between a gate and a drain adjacent thereto among the plurality of gates and the plurality of drains and a distance between a gate and a source adjacent thereto among the plurality of gates and the plurality of sources.

In an embodiment of the present disclosure, the second electrode is electrically connected to an adjacent source to share a source electrode connected to the adjacent source.

In an embodiment of the present disclosure, there is no gap between the second electrode of the test device and an adjacent source of the standard device.

In an embodiment of the present disclosure, the test device includes a substrate, a semiconductor functional layer disposed on the substrate, and the first electrode and the second electrode are disposed on the semiconductor functional layer, wherein the test device further includes an isolation layer disposed between a semiconductor functional layer under the first electrode and a semiconductor functional layer under the second electrode.

In an embodiment of the present disclosure, the test device further includes a third electrode that is the same as the other of the sources and the gates.

In an embodiment of the present disclosure, the third electrode is electrically connected to an adjacent source to share a source electrode connected to the adjacent source.

In an embodiment of the present disclosure, there is no gap between the third electrode of the test device and an adjacent source of the standard device.

In an embodiment of the present disclosure, the plurality of sources and the plurality of drains are alternately arranged, the plurality of gates are interdigitated between adjacent sources and drains, the plurality of gates are connected together through a gate interconnection wire and connected to gate electrodes formed in the passive region, and the plurality of drains are connected together through a drain interconnection wire and connected to drain electrodes formed in the passive region.

In an embodiment of the present disclosure, the plurality of sources are respectively connected to a plurality of source electrodes formed in the passive region through a plurality of air bridges crossing the gate interconnection wire; each source of the plurality of sources is provided with at least one through hole, and the source is connected to a source electrode corresponding to the source formed in the passive region through the at least one through hole.

The present disclosure also provides a method of manufacturing a semiconductor device, including: providing a substrate; forming a semiconductor functional layer based on the substrate; forming an active region, a test region and a passive region based on the semiconductor functional layer; forming a plurality of sources, a plurality of gates and a plurality of drains in the active region to form a standard device; and forming a first electrode same as the drains and a second electrode same as one of the sources and the gates in the test region to form a test device for testing performance parameters of the standard device.

In an embodiment of the present disclosure, a third electrode same as the other of the sources and the gates is formed in the test region.

In an embodiment of the present disclosure, a plurality of source electrodes, a plurality of drain electrodes and a plurality of gate electrodes are formed in the passive region, and the method further includes: connecting the sources of the standard device to the source electrodes; forming a drain interconnection wire in the passive region, connecting the drains of the standard device together through the drain interconnection wire and connecting the drains to the drain electrodes; and forming a gate interconnection wire in the passive region, connecting the gates of the standard device together through the gate interconnection wire and connecting the gates to the gate electrodes.

According to the present disclosure, by fabricating a test device around the standard device, corresponding electrical parameters of the standard device can be estimated in the wafer-level test by testing electrical performance parameters of the test device, so that qualified standard devices can be screened out according to test results, without cutting, packaging and testing the standard device with a large size, thereby avoiding the problem that some electrical parameters of the standard device, such as saturation current and output power, cannot be obtained through the wafer-level test, saving the test process and reducing the production cycle. In addition, the qualified standard device can be cut and packaged accordingly, thereby effectively reducing the production cost.

BRIEF DESCRIPTION OF THE DRAWINGS

In order to describe the technical solutions of the embodiments of the present disclosure more clearly, accompanying drawings to be used in the embodiments will be briefly introduced below. It should be understood that the drawings below merely show some embodiments of the present disclosure and thus cannot be considered as limitations to the scope. A person of ordinary skills in the art may also obtain other relevant drawings according to these drawings without paying any creative effort.

Figure 1:
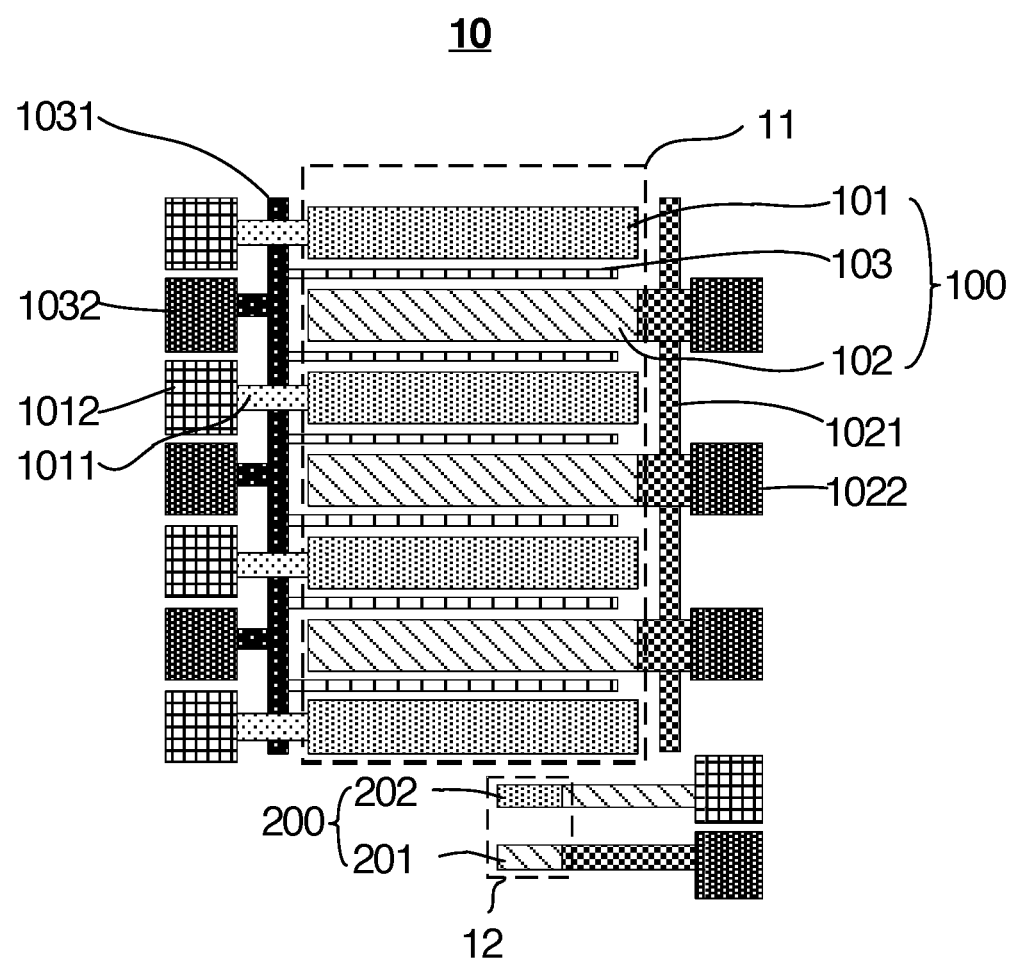
FIG. 1 is a schematic diagram of a semiconductor device according to a first embodiment of the present disclosure.

Reference signs in the figures mentioned above:

DETAILED DESCRIPTION

Technical solutions in the embodiments of the present disclosure will be described clearly and completely with reference to the accompanying drawings in the present disclosure. Apparently, the embodiments described herein are merely some but not all the embodiments of the present disclosure. In general, the components in the embodiments of the present disclosure described and shown in the drawings herein may be arranged and designed in different configurations.

The detailed description of the embodiments of the present disclosure as provided in the drawings below is not intended to limit the protection scope of the present disclosure, but merely to denote the selected embodiments of the present disclosure. Based on the embodiments of the present disclosure, all other embodiments obtained by those skilled in the art without paying creative effort belong to the protection scope of the present disclosure.

It should be noted that like reference characters and letters denote like items in the following drawings. Thus, once a certain item is defined in one drawing, there is no need to define and explain it again in the subsequent drawings. Meanwhile, in the description of the present disclosure, terms "first", "second", etc. are merely used for differentiating, and cannot be interpreted to indicate or imply any relative importance.

First Embodiment

FIG. 1 shows a schematic top view of a semiconductor device 10 provided by an embodiment of the present disclosure. The semiconductor device 10 may include an active region 11, a test region 12, and a passive region located outside the active region 11 and the test region 12.

A standard device 100 is fabricated in the active region 11, and a test device 200 for testing performance parameters of the standard device 100 is fabricated in the test region 12. Two-dimensional electron gas, electrons or holes exist under the active region 11 which is a working region of the semiconductor device 10. Two-dimensional electron gas, electrons or holes under the passive region are eliminated or isolated by a mesa etching process, an ion implantation process or an oxidation isolation process, and the passive region is not an internal working region of the semiconductor device 10.

Figure 2:
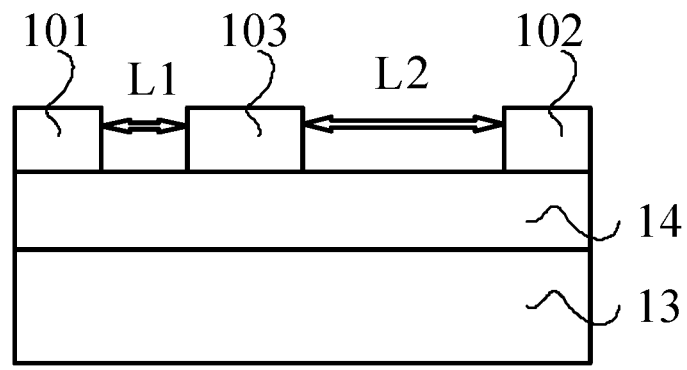
FIG. 2 is a schematic cross-sectional diagram of a standard device having a set of source, gate and drain according to the first embodiment of the present disclosure.

As shown in FIG. 2, the semiconductor device 10 may further include a substrate 13, a semiconductor functional layer 14 fabricated on the substrate 13, and a plurality of electrodes fabricated on the semiconductor functional layer 14. The standard device 100 includes a plurality of sources 101, a plurality of drains 102 and a plurality of gates 103. The test device 200 includes a first electrode 201 same as the drain 102 and a second electrode 202 same as one of the source 101 and the gate 103. In the embodiment of the present disclosure, the first electrode 201 is the same as the drain 102 means that composition materials of the first electrode 201 are the same as those of the drain 102 and the first electrode 201 and the drain 102 are fabricated under the same manufacturing process. Similarly, the second electrode 202 is the same as one of the source 101 and the gate 103 means that, composition materials of the second electrode 202 are the same as those of the source 101 or the gate 103, and the second electrode 202 and the source 101 or gate 103 are fabricated under the same manufacturing process.

Optionally, the source 101 and drain 102 of the standard device 100 may be one metal material or a composite material of multiple metal materials. The gate 103 may be a single-layer metal gate 103, or may be a double-layer metal stack or a multi-layer gate 103 structure. Correspondingly, the first electrode 201 of the test device 200 may be one metal material or a composite material of multiple metal materials. When the second electrode 202 is the same as the source 101, it may be a metal material or a composite material of multiple metal materials. When the second electrode 202 is the same as the gate 103, it may be a single-layer metal gate 103, may also be a double-layer metal stack or a multi-layer gate 103 structure.

Optionally, the gate 103 of the standard device 100 may be a Schottky contact electrode, the source 101 and the drain 102 are alternately arranged, and the gate 103 is interdigitated between the source 101 and the drain 102. The source 101 and the drain 102 may be ohmic contact electrodes, and the plurality of drains 102 are connected together through a drain interconnection wire 1021 and connected to drain electrodes 1022 fabricated in the passive region. At the same time, the plurality of gates 103 are connected together through a gate interconnection wire 1031 and connected to gate electrode 1032 fabricated in passive region. The drain interconnection wire 1021 and the gate interconnection wire 1031 may be made of metal or other materials, and embodiments of the present disclosure are not limited thereto. In an embodiment of the present disclosure, the source 101 of the standard device 100 may cross the gate interconnection wire 1031 through an air bridge 1011 and be connected to a source electrode 1012 of the passive region. The standard device 100 is an integral large gate width device with a large operating current, so that a large output power can be obtained to meet practical application requirements. The gate electrode 1032 and the drain electrode 1022 are used for connecting with external elements and for connecting the gate 103 and the drain 102 to the external elements.

Optionally, connecting electrodes for respectively connecting with the first electrode 201 and the second electrode 202 are also fabricated in the passive region, and the first electrode 201 and the second electrode 202 of the test device 200 may be connected with the connecting electrodes in the passive region through interconnection metals or other materials.

Optionally, lead pads may be fabricated on the drain interconnection wire 1021 or the gate interconnection wire 1031 to input signals into the semiconductor device 10.

Optionally, the structure of the standard device 100 may be a conventional semiconductor device such as a bipolar transistor (BJT), a metal semiconductor field effect transistor (MESFET), a junction field effect transistor (JFET), a lateral diffusion metal oxide semiconductor (LDMOS) and a high electron mobility transistor (HEMT). The material of the standard device 100 may be any one or a combination of materials such as silicon (Si), gallium nitride (GaN) and gallium arsenide (GaAs).

In an embodiment of the present disclosure, the standard device 100 and the test device 200 may be fabricated on a semiconductor wafer based on a same substrate, a semiconductor functional layer is fabricated on the substrate, the plurality of sources 101, drains 102 and gates 103 of the standard device 100 are fabricated on the semiconductor functional layer, and the first electrode 201 and the second electrode 202 of the test device 200 are fabricated. A size of the test device 200 is smaller than that of the standard device 100, and the gate width of the test device 200 is smaller than the gate width of the standard device, and thus the test device 200 has a low test current and can meet wafer-level tests of related parameters such as power and saturation current. Therefore, corresponding electrical parameters of the standard device 100 can be estimated so as to facilitate to screen out a qualified standard device 100. At the same time, the relevant electrical performance of the standard device 100 can also be obtained by testing the test device 200 with a specific structure, thereby avoiding the problem that the standard device 100 needs to be cut and packaged one by one to measure the relevant parameters due to its large size, and effectively reducing the production cost.

In summary, the test device 200 is fabricated with the same materials and processes as the standard device 100, so that the test device 200 and the standard device 100 have an electrical characteristic correlation. The electrical characteristics of the test device 200 having correlation with the standard device 100 may include parameters such as current, voltage, resistance, inductance, capacitance, power, gain, efficiency, impedance, or a combination of multiple parameters. The test device 200 may have a normal electrical characteristic function, may independently perform direct current or radio frequency electrical characteristic measurement, or may perform other forms of electrical characteristic measurement, so that the electrical performance of the standard device 100 may be estimated by testing the electrical performance of the test device 200.

In an embodiment of the present disclosure, the test device 200 having two electrodes can form a Schottky diode structure. A distance between the test device 200 and the standard device 100 may be predetermined, and optionally, the distance is less than or equal to 10 mm.

Figure 3:
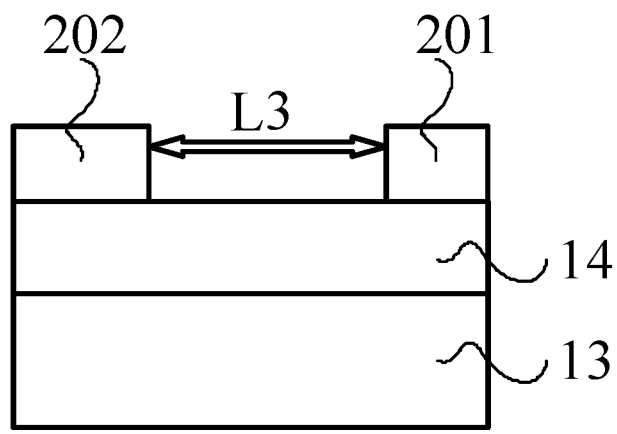
FIG. 3 is a schematic cross-sectional diagram of a test device according to the first embodiment of the present disclosure.

FIG. 2 is a schematic cross-sectional diagram of a standard device 100 having a set of source, gate and drain. In detail, as shown in FIG. 3, in a specific embodiment, the first electrode 201 of the test device 200 is the same as the drain 102 of the standard device 100 and serves as the cathode of the Schottky diode. The second electrode 202 is the same as the gate 103 of the standard device 100 and serves as the anode of the Schottky diode. The distance L3 between the first electrode 201 and the second electrode 202 is the same as the distance L2 (gate-drain distance) between the gate 103 and the drain 102.

By setting the structure of the test device 200 in this way, the carrier concentration of the semiconductor functional layer 14 of the test region 12 can be obtained by testing the voltage and capacitance characteristics of the test device 200, so that the carrier concentration of the semiconductor functional layer 14 where the standard device 100 is located can be obtained. At the same time, the Schottky diode structure formed by the test device 200 is equivalent to the gate-drain structure of the standard device 100, and the gate leakage characteristics of the standard device 100 can be estimated by testing the performance of the test device 200.

Figure 4:
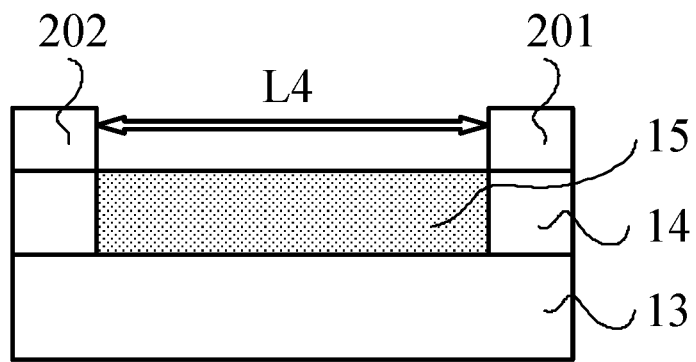
FIG. 4 is a schematic cross-sectional diagram of another test device according to the first embodiment of the present disclosure.

In detail, as shown in FIG. 4, in another specific embodiment, the first electrode 201 is the same as the drain 102. The present embodiment differs from the previous embodiment in that the second electrode 202 is the same as the source 101, and the distance L4 between the first electrode 201 and the second electrode 202 is equal to the sum of the distance L2 between the gate 103 and the drain 102 and the distance L1 (gate-source distance) between the gate 103 and the source 101.

When making such a test device 200, an isolation layer 15 may be formed between a semiconductor functional layer 14 under the first electrode 201 and a semiconductor functional layer 14 under the second electrode 202, and the two-dimensional electron gas, electrons or holes under the isolation layer 15 may be eliminated or isolated through an ion implantation process or an oxidation isolation process.

Such a structure is similar to that of the standard device 100 in the off state, and the leakage of the substrate 13 can be obtained by testing the current-voltage relationship of the test device 200, so as to estimate the leakage characteristics of the substrate when the standard device 100 is in the off state.

In the embodiment of the present disclosure, by fabricating a test device 200 around the standard device 100, the corresponding electrical parameters of the standard device 100 can be estimated in the wafer-level test by testing the electrical performance parameters of the test device 200, so that the qualified standard device 100 can be screened out according to the test results, and the standard device 100 with a large size need not be cut, packaged and tested, thereby avoiding the problem that some electrical parameters of the standard device 100, such as saturation current and output power, cannot be obtained through the wafer-level test, saving the test process and reducing the production cycle; in addition, the qualified standard device 100 can be cut and packaged accordingly, thus effectively reducing the production cost.

Second Embodiment

Figure 5:
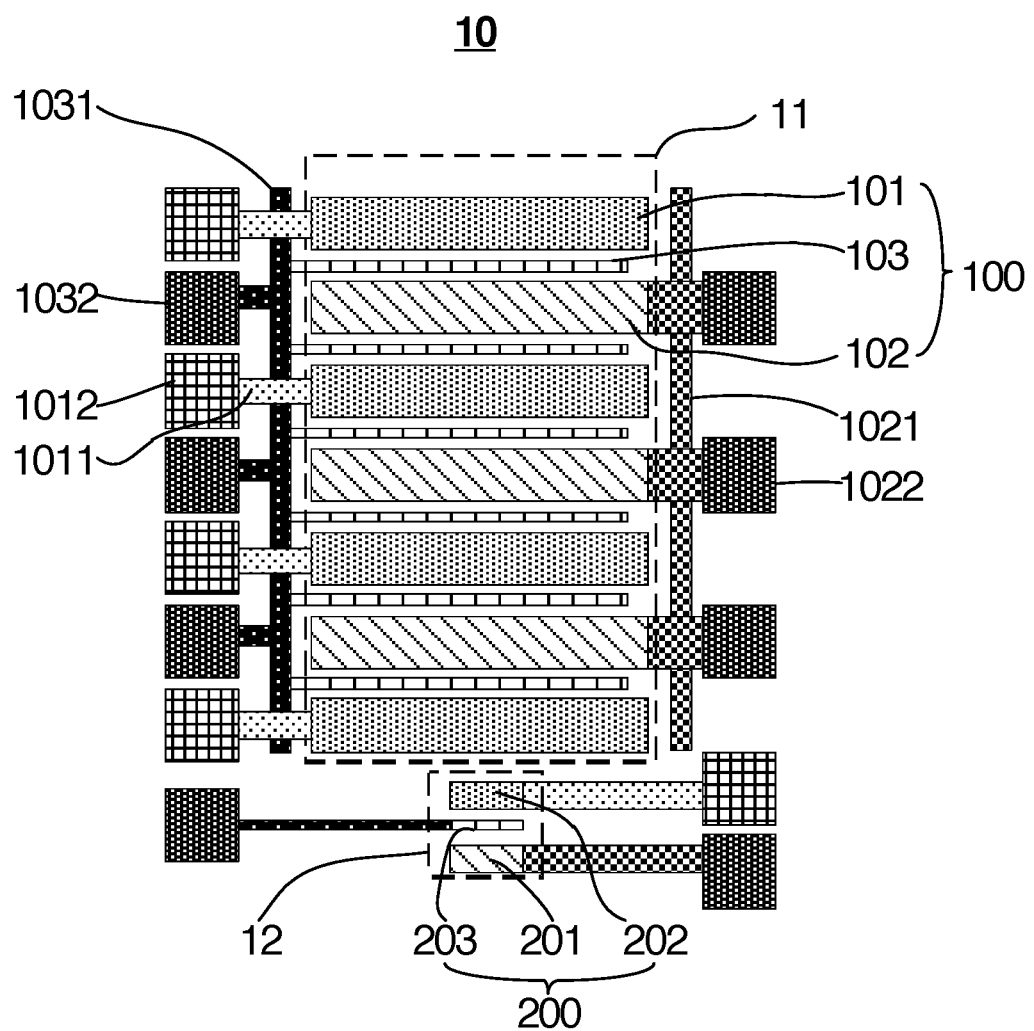
FIG. 5 is a schematic diagram of a semiconductor device according to a second embodiment of the present disclosure.

As shown in FIG. 5, the present embodiment differs from the first embodiment in that the test device 200 may further include a third electrode 203, as described above, the first electrode 201 is the same as the drain 102, the second electrode 202 is the same as one of the source 101 and the gate 103, and the third electrode 203 is the same as the other of the source 101 and the gate 103.

By setting the test device 200 with three electrodes, the test device 200 forms a device including a single source, a single gate and a single drain, the first electrode 201 may be an ohmic contact electrode, the electrode same as the source 101 (e.g., the second electrode 202) may be an ohmic contact electrode, and the electrode same as the gate 103 (e.g., the third electrode 203) may be a Schottky contact electrode. The test device 200 forms a single cell structure with a gate width smaller than that of the standard device 100. The distance between the test region 12 and the active region 11 may be determined according to actual needs, that is, the distance between the test device 200 and the standard device 100 may be less than or equal to 10 mm.

Optionally, the structure of the standard device 100 and the test device 200 may be a conventional semiconductor device such as a bipolar transistor (BJT), a metal semiconductor field effect transistor (MESFET), a junction field effect transistor (JFET), a lateral diffusion field effect transistor (LDMOS) and a high electron mobility transistor (HEMT). The material of the standard device 100 and the test device 200 may be any one or a combination of materials such as silicon (Si), gallium nitride (GaN) and gallium arsenide (GaAs).

Optionally, the first electrode 201 of the test device 200 may be one metal material or a composite material of multiple metal materials. The electrode same as the source 101 may be one metal material or a composite material of multiple metal materials. The electrode same as the gate 103 may be a single-layer metal gate 103, may also be a double-layer metal stack or a multi-layer gate 103 structure.

By testing the electrical performance of the test device 200 with three electrodes, the corresponding electrical performance of the standard device 100 can be estimated.

Third Embodiment

The present embodiment differs from the second embodiment in that the second electrode 202 or the third electrode 203 is electrically connected to an adjacent source 101 to share the source electrode 1012 connected to the source 101 for testing. In other words, on a side of the test device close to the standard device, the second electrode 202 or the third electrode 203 may be shared with an adjacent source 101, that is, there is no gap between the shared source 101 and the second electrode 202 or the third electrode 203 of the test device.

Figure 6:
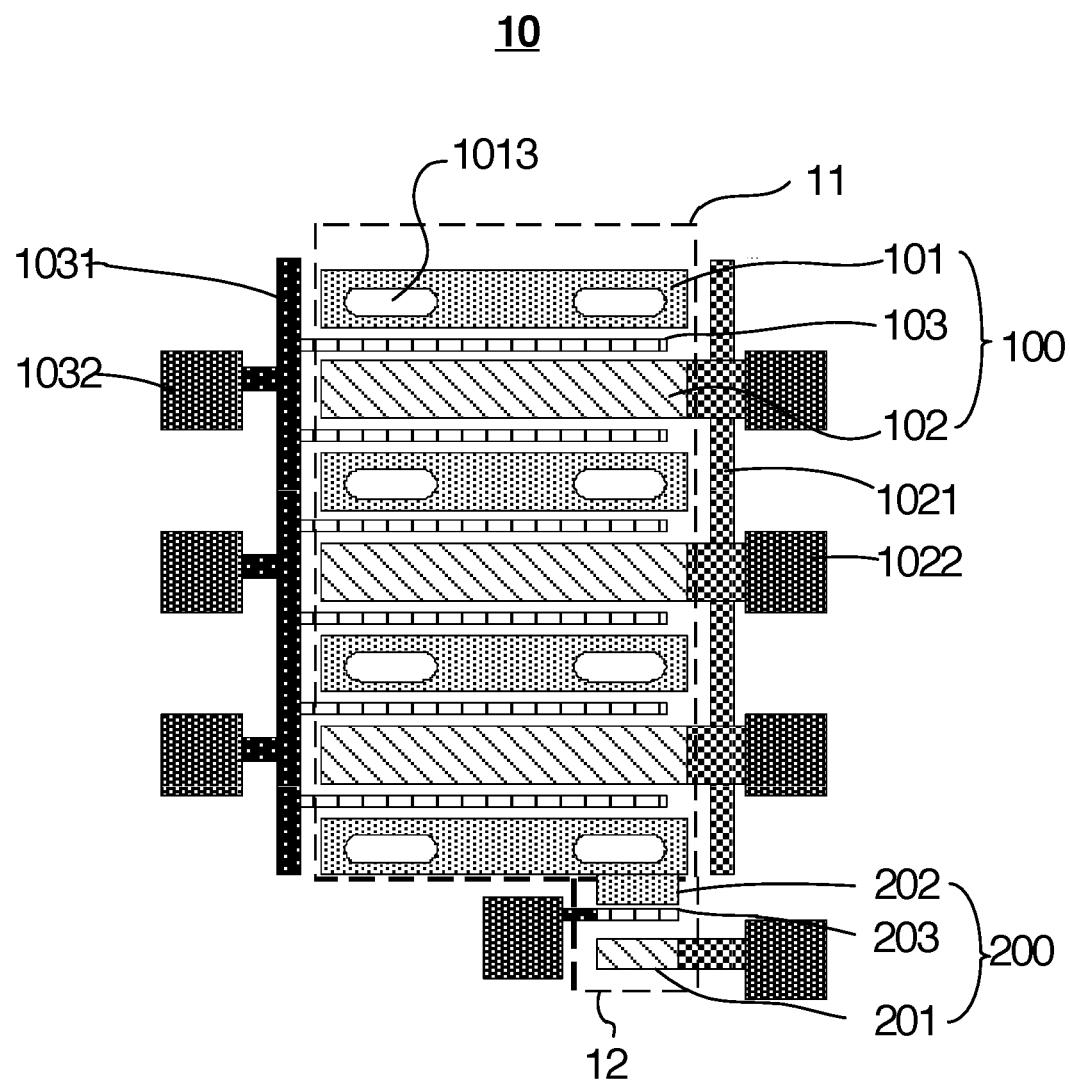
FIG. 6 is a schematic diagram of a semiconductor device according to a third embodiment of the present disclosure.

Optionally, the source 101 is provided with through holes 1013, and the source 101 is connected to the source electrode 1012 fabricated in the passive region through the through holes 1013. The through holes 1013 penetrates the substrate 13 and the semiconductor functional layer 14 under the source 101, so that the source 101 can be connected to the source electrode 1012 through the provided back metal, and the source electrode 1012 is disposed on the back surface of the source 101, which is not shown in FIG. 6. In this embodiment, the second electrode 202 is the same as the source 101, and the second electrode 202 is connected to an adjacent source 101 of the standard device 100, thus realizing the effect that the test device 200 and the standard device 100 share one source electrode 1012.

By the design of the common electrode, a distance between the test device 200 and the standard device 100 is smaller, which reduces the occupied area of the test device 200. At the same time, the through holes 1013 are provided on the source 101 of the standard device 100, so that the source 101 can be connected to the source electrode 1012 through the back metal, and thus the occupied area of the standard device 100 may be further reduced and the yield of the whole wafer material may be increased.

In the previous embodiment, the test device 200 does not share an electrode with the standard device 100, so a certain distance between the test device 200 and the standard device 100 is required. This will cause errors due to the material or process non-uniformity and affect the judgment of the performance of the standard device 100. According to the design that the test device 200 and the standard device 100 share a source electrode in this embodiment, errors due to the material or process non-uniformity can be avoided, and the accuracy of the performance judgment of the standard device 100 can be increased.

The test device 200 in the second and third embodiment is a single cell structure including three electrodes, and the standard device 100 is a multi-cell structure. The gate width of the test device 200 is smaller than the gate width of the standard device 100 and the test device 200 has a smaller test current, which can satisfy the wafer-level test of related parameters such as power and saturation current, thereby estimating and obtaining the electrical parameters of the standard device 100.

Figure 7:
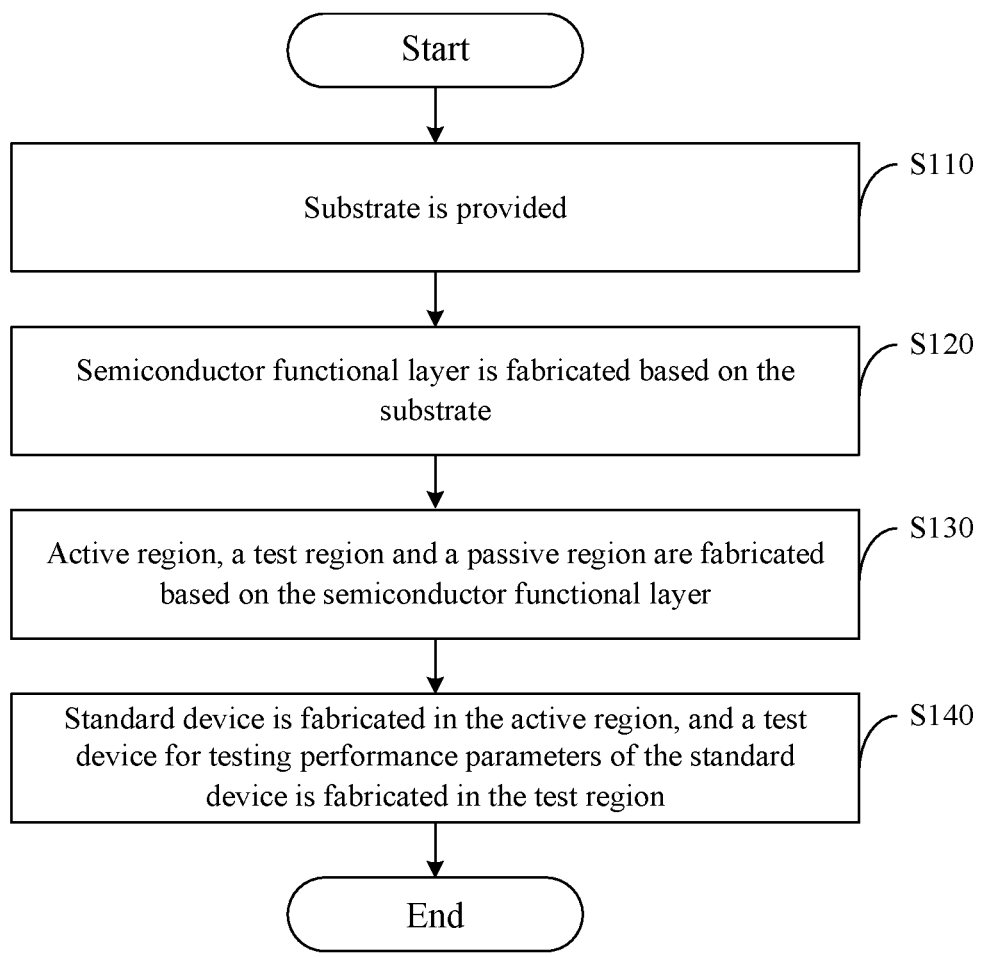
FIG. 7 is a flowchart of a method of manufacturing a semiconductor device according to an embodiment of the present disclosure.

The embodiment of the present disclosure also provides a method of manufacturing a semiconductor device, as shown in FIG. 7, the method of manufacturing a semiconductor device includes steps S110, S120, S130 and S140. The steps will be described below.

Step S110, a substrate is provided.

Step S120, a semiconductor functional layer is fabricated based on the substrate.

The step of fabricating the semiconductor functional layer on the substrate can be determined according to the type of device actually required to be fabricated, and details are not described herein again.

Step S130, an active region, a test region and a passive region are fabricated based on the semiconductor functional layer.

Step S140, a standard device is fabricated in the active region, and a test device for testing performance parameters of the standard device is fabricated in the test region.

Specifically, the specific locations of the active region, the test region and the passive region are determined according to the range of the standard device and the type of the test device, and are fabricated according to the structure of the standard device and the structure of the test device. The specific method of the fabrication and the specific structure can be seen in the above structural embodiments.

A plurality of sources, a plurality of gates and a plurality of drains are fabricated in the active region to form the standard device.

The standard device can be fabricated according to the actual required structure. When the structure in the passive region is fabricated, a plurality of source electrodes, drain electrodes and gate electrodes can be fabricated in the passive region. The method further includes: the sources of the standard device are connected to the source electrodes; a drain interconnection wire is formed in the passive region, the drains of the standard device are connected through the drain interconnection wire and connected to the drain electrodes; a gate interconnection wire is formed in the passive region, the gates of the standard device are connected through the gate interconnection wire and connected to the drain electrodes.

A first electrode same as the drain and a second electrode same as one of the source and the gate are fabricated in the test region to form the test device.

The test device is used to test performance parameters of the standard device. The test device can be fabricated according to the actual required structure, as described above, the test device can be fabricated into a two-terminal device. At the same time, a third electrode can also be fabricated in the test region, and the third electrode is the same as the other of the source and the gate to form a three-terminal device. The specific structure and specific effect of the test device can be seen in the above-mentioned structural embodiments, and will not be described here.

When the test device is fabricated as a two-terminal device, an isolation layer can be formed on the semiconductor functional layer under the electrode of the test device according to actual requirements, and the specific structure can be seen in the description of the first embodiment.

By correspondingly connecting the sources, drains and gates of the standard device with the source, drain and gate electrodes in the passive region, the manufacture of the standard device is completed. The source of the standard device can be connected to the source electrode in two ways. One is that an air bridge is fabricated to connect the source and the source electrode, and the air bridge crosses the gate interconnection wire. The other includes: through holes penetrating the substrate and the semiconductor functional layer where the source electrode is located are fabricated; the source electrode is fabricated on a side of the substrate away from the semiconductor functional layer, the source electrode is connected to the source through the through holes, and the second electrode is electrically connected to an adjacent source electrode to share the source electrode connected to the source. The structure and effect of the through holes are described in the above embodiments and will not be described here.

In the semiconductor device and the method of manufacturing the same provided by the embodiments of the present disclosure, by fabricating a test device around the standard device, corresponding electrical parameters of the standard device can be estimated in the wafer-level test by testing electrical performance parameters of the test device, so that qualified standard devices can be screened out according to test results, without cutting, packaging and testing the standard device with a large size, thereby avoiding the problem that some electrical parameters of the standard device, such as saturation current and output power, cannot be obtained through the wafer-level test, saving the test process and reducing the production cycle. In addition, the qualified standard device can be cut and packaged accordingly, thereby effectively reducing the production cost.

In the descriptions of the present disclosure, it should be noted that unless otherwise clearly specified and defined, the terms such as "dispose", "interconnect" and "connect" should be understood in the broad sense. For example, there may be a fixed connection, a detachable connection, or an integral connection; there may be a mechanical connection, or an electrical connection; there may be a direct interconnection, an indirect interconnection via an intermediate medium, or an internal connection between two components. A person of ordinary skills in the art may understand specific meanings of the foregoing terms in the present disclosure according to specific circumstances.

In the descriptions of the present disclosure, it should be noted that azimuth or positional relationships indicated by the terms such as "up", "down", "inside" and "outside" and the like are azimuth or positional relationships shown in the drawings, or usual azimuth or positional relationships when using the products of the present disclosure, which are only to facilitate description of the embodiments of the present disclosure and simplify the description, but not to indicate or imply that the device or component must have a specific azimuth, or be constructed or operated in the specific azimuth, which thus cannot be understood as a limitation to the present disclosure.

The above description is only preferred embodiments of the present disclosure and should not be intended to limit the present disclosure. Those skilled in the art can make various modifications and variations to the present disclosure. Any modification, equivalent substitution, improvement etc. made within the principle of the present disclosure should be encompassed in the protection scope of the present disclosure.

What is claimed is:

1. A semiconductor device, comprising: an active region, a test region and a passive region located outside the active region and the test region, wherein a standard device is formed in the active region, and a test device for testing performance parameters of the standard device is formed in the test region; wherein the standard device comprises a plurality of sources, a plurality of drains and a plurality of gates; and the test device comprises a first electrode and a second electrode, wherein the first electrode is the same as the drains and the second electrode is the same as one of the sources and the gates.

2. The semiconductor device according to claim 1, wherein the test device and the standard device have an electrical characteristic correlation, and the test device has a normal electrical characteristic function and is capable of independently performing electrical characteristic measurement.

3. The semiconductor device according to claim 1, wherein a size of the test device is smaller than that of the standard device, and a gate width of the test device is smaller than that of the standard device.

4. The semiconductor device according to claim 1, wherein the second electrode is the same as the gates, and a distance between the first electrode and the second electrode is equal to a distance between a gate and a drain adjacent thereto among the plurality of gates and the plurality of drains.

5. The semiconductor device according to claim 1, wherein the second electrode is the same as the sources, and a distance between the first electrode and the second electrode is equal to a sum of a distance between a gate and a drain adjacent thereto among the plurality of gates and the plurality of drains and a distance between a gate and a source adjacent thereto among the plurality of gates and the plurality of sources.

6. The semiconductor device according to claim 1, wherein the second electrode is electrically connected to an adjacent source to share a source electrode connected to the adjacent source.

7. The semiconductor device according to claim 1, wherein there is no gap between the second electrode of the test device and an adjacent source of the standard device.

8. The semiconductor device according to claim 1, wherein the test device comprises a substrate, a semiconductor functional layer disposed on the substrate, and the first electrode and the second electrode are disposed on the semiconductor functional layer, wherein the test device further comprises an isolation layer disposed between a semiconductor functional layer under the first electrode and a semiconductor functional layer under the second electrode.

9. The semiconductor device according to claim 1, wherein the test device further comprises a third electrode that is the same as the other of the sources and the gates.

10. The semiconductor device according to claim 9, wherein the third electrode is electrically connected to an adjacent source to share a source electrode connected to the adjacent source.

11. The semiconductor device according to claim 9, wherein there is no gap between the third electrode of the test device and an adjacent source of the standard device.

12. The semiconductor device according to claim 1, wherein the plurality of sources and the plurality of drains are alternately arranged, the plurality of gates are interdigitated between adjacent sources and drains, the plurality of gates are connected together through a gate interconnection wire and connected to gate electrodes formed in the passive region, and the plurality of drains are connected together through a drain interconnection wire and connected to drain electrodes formed in the passive region.

13. The semiconductor device according to claim 12, wherein the plurality of sources are respectively connected to a plurality of source electrodes formed in the passive region through a plurality of air bridges crossing the gate interconnection wire; each source of the plurality of sources is provided with at least one through hole, and the source is connected to a source electrode corresponding to the source formed in the passive region through the at least one through hole.

14. A method of manufacturing a semiconductor device, comprising:
providing a substrate;
forming a semiconductor functional layer based on the substrate;
forming an active region, a test region and a passive region based on the semiconductor functional layer;
forming a plurality of sources, a plurality of gates and a plurality of drains in the active region to form a standard device; and
forming a first electrode same as the drains and a second electrode same as one of the sources and the gates in the test region to form a test device for testing performance parameters of the standard device.

15. The method according to claim 14, wherein a third electrode same as the other of the sources and the gates is formed in the test region.

16. The method according to claim 14, wherein a plurality of source electrodes, a plurality of drain electrodes and a plurality of gate electrodes are formed in the passive region, and the method further comprises:
connecting the sources of the standard device to the source electrodes;
forming a drain interconnection wire in the passive region, connecting the drains of the standard device together through the drain interconnection wire and connecting the drains to the drain electrodes; and
forming a gate interconnection wire in the passive region, connecting the gates of the standard device together through the gate interconnection wire and connecting the gates to the gate electrodes.

17. The method according to claim 15, wherein a plurality of source electrodes, a plurality of drain electrodes and a plurality of gate electrodes are formed in the passive region, and the method further comprises:
connecting the sources of the standard device to the source electrodes;
forming a drain interconnection wire in the passive region, connecting the drains of the standard device together through the drain interconnection wire and connecting the drains to the drain electrodes; and
forming a gate interconnection wire in the passive region, connecting the gates of the standard device together through the gate interconnection wire and connecting the gates to the gate electrodes.

* * * * *